(12) United States Patent
Kanazawa

(10) Patent No.: US 10,351,083 B2
(45) Date of Patent: Jul. 16, 2019

(54) CONNECTION CONNECTOR, CONNECTION CONNECTOR-PROVIDED FLAT CABLE, AND ROTARY CONNECTOR DEVICE

(71) Applicants: Furukawa Electric Co., Ltd., Tokyo (JP); Furukawa Automotive Systems Inc., Inukami-gun (JP)

(72) Inventor: Masashi Kanazawa, Tokyo (JP)

(73) Assignees: Furukawa Electric Co., Ltd., Tokyo (JP); Furukawa Automotive Systems Inc., Inukami-gun (JP)

( * ) Notice: Subject to any disclaimer, the term of this patent is extended or adjusted under 35 U.S.C. 154(b) by 0 days.

(21) Appl. No.: 16/076,476

(22) PCT Filed: Feb. 14, 2017

(86) PCT No.: PCT/JP2017/005285
§ 371 (c)(1),
(2) Date: Aug. 8, 2018

(87) PCT Pub. No.: WO2017/141898
PCT Pub. Date: Aug. 24, 2017

(65) Prior Publication Data
US 2019/0047490 A1 Feb. 14, 2019

(30) Foreign Application Priority Data
Feb. 17, 2016 (JP) ................................ 2016-027835

(51) Int. Cl.
*H01R 3/00* (2006.01)
*B60R 16/027* (2006.01)
(Continued)

(52) U.S. Cl.
CPC ............. *B60R 16/027* (2013.01); *H01R 9/07* (2013.01); *H01R 12/00* (2013.01); *H01R 13/66* (2013.01);
(Continued)

(58) Field of Classification Search
CPC .............................. H01R 35/025; H01R 35/02
(Continued)

(56) References Cited

U.S. PATENT DOCUMENTS 3,538,479 A * 11/1970 Fister ................. H01H 85/0456
337/161
3,744,003 A * 7/1973 Dipace ................... H01H 85/20
337/209
(Continued)

FOREIGN PATENT DOCUMENTS

JP 2-146761 U 12/1990
JP 2002-184532 A 6/2002
(Continued)

OTHER PUBLICATIONS

International Search Report dated May 16, 2017 in PCT/JP2017/005285 filed Feb. 14, 2017.
(Continued)

*Primary Examiner* — Phuong Chi T Nguyen
(74) *Attorney, Agent, or Firm* — Oblon, McClelland, Maier & Neustadt, L.L.P.

(57) ABSTRACT

A connection connector, which is arranged at an end section of an FFC including strip-shaped conductors, includes a busbar including a connection pin section to be connected to another terminal, and a resin holder configured to hold the busbar. The busbar includes a conductor connection section to be electrically connected to a strip-shaped conductor, and a longitudinal coupling section coupling the connection pin section with the conductor connection section. The longitudinal coupling section includes a resistance element arrangement space in which a resistance element can be arranged, and a selective detachment section configured to be selectively detached depending on an arrangement of the resistance element in the resistance element arrangement space and electrically separate the connection pin section and the conductor connection section.

19 Claims, 8 Drawing Sheets

1 CONNECTION CONNECTOR-PROVIDED FLAT CABLE
10A CONNECTION CONNECTOR
20A RESIN HOLDER
52 LEAD ARRANGEMENT SECTION
55 INSPECTION CONNECTION SECTION
80 RESISTANCE ELEMENT
81 LEAD SECTION
90 HOUSING CASE
100 FFC
101 STRIP-SHAPED CONDUCTOR

(51) Int. Cl.
  *H01R 13/66* (2006.01)
  *H01R 12/00* (2006.01)
  *H01R 35/04* (2006.01)
  *G01R 31/04* (2006.01)

(52) U.S. Cl.
  CPC .......... *H01R 35/04* (2013.01); *G01R 31/045* (2013.01); *H01R 2201/26* (2013.01)

(58) Field of Classification Search
  USPC .................................................. 439/164, 15
  See application file for complete search history.

(56) References Cited

U.S. PATENT DOCUMENTS 4,725,698 A * 2/1988 Takai .................... H01R 31/02
  200/16 R
4,838,814 A * 6/1989 Takai .................... H01R 31/02
  307/147
5,668,522 A * 9/1997 Kondo ............... H01H 85/0417
  337/160
2003/0017745 A1 1/2003 Maegawa

FOREIGN PATENT DOCUMENTS

| | | |
|---|---|---|
| JP | 2003-32871 A | 1/2003 |
| JP | 2006-107809 A | 4/2006 |
| JP | 2013-191437 A | 9/2013 |

OTHER PUBLICATIONS

Office Action dated Apr. 30, 2019 in corresponding Chinese Patent Application No. 201760008100, filed Feb. 14, 2017, with English-language Translation, 14 pages, documents cited therein have been previously submitted.

* cited by examiner

1 CONNECTION CONNECTOR-PROVIDED FLAT CABLE
10A CONNECTION CONNECTOR
20A RESIN HOLDER
52 LEAD ARRANGEMENT SECTION
55 INSPECTION CONNECTION SECTION
80 RESISTANCE ELEMENT
81 LEAD SECTION
90 HOUSING CASE
100 FFC
101 STRIP-SHAPED CONDUCTOR

10A CONNECTION CONNECTOR
20A RESIN HOLDER
24 SIDE EXTENDED SECTION
40A BUSBAR
41 CONNECTION PIN SECTION
42 LONGITUDINAL COUPLING SECTION
43 CONDUCTOR CONNECTION SECTION
51 RESISTANCE ELEMENT ARRANGEMENT SPACE
52, 53 LEAD ARRANGEMENT SECTION
54 SELECTIVE DETACHMENT SECTION
55 INSPECTION CONNECTION SECTION
80 RESISTANCE ELEMENT
81 LEAD SECTION

41 CONNECTION PIN SECTION
42 LONGITUDINAL COUPLING SECTION
43 CONDUCTOR CONNECTION SECTION

| 10A CONNECTION CONNECTOR | 42 LONGITUDINAL COUPLING SECTION | 54 SELECTIVE DETACHMENT SECTION |
| 20A RESIN HOLDER | 43 CONDUCTOR CONNECTION SECTION | 55 INSPECTION CONNECTION SECTION |
| 24 SIDE EXTENDED SECTION | 51 RESISTANCE ELEMENT ARRANGEMENT SPACE | 80 RESISTANCE ELEMENT |
| 40A BUSBAR | 52, 53 LEAD ARRANGEMENT SECTION | 81 LEAD SECTION |
| 41 CONNECTION PIN SECTION | | |

| 10A CONNECTION CONNECTOR | 41 CONNECTION PIN SECTION | 51 RESISTANCE ELEMENT ARRANGEMENT SPACE | 55 INSPECTION CONNECTION SECTION |
| 20A RESIN HOLDER | 42 LONGITUDINAL COUPLING SECTION | 52, 53 LEAD ARRANGEMENT SECTION | 80 RESISTANCE ELEMENT |
| 40A BUSBAR | 43 CONDUCTOR CONNECTION SECTION | 54 SELECTIVE DETACHMENT SECTION | 81 LEAD SECTION |

200 SRC
210 ROTATOR
211 ROTATING-SIDE RING PLATE
212 INNER-CIRCUMFERENTIAL CYLINDRICAL SECTION
220 STATOR
221 STATIONARY-SIDE RING PLATE
222 STATOR-SIDE OUTER-CIRCUMFERENTIAL CYLINDRICAL SECTION

CONNECTION CONNECTOR, CONNECTION CONNECTOR-PROVIDED FLAT CABLE, AND ROTARY CONNECTOR DEVICE

TECHNICAL FIELD

The present invention relates to a connection connector arranged at an end section of a flat cable used in an automobile and the like, a connection connector-provided flat cable, and a rotary connector device including the connection connector-provided flat cable.

BACKGROUND

For example, a rotary connector device mounted on a vehicle body, such as an automobile, includes a rotator and a stator, these being combined so as to be rotatable relative to each other, and houses a wound flexible flat cable (hereinafter referred to as a flat cable) in an annular housing space formed between the rotator and the stator.

The flat cable housed in the rotary connector device is a connection connector-provided flat cable including connection connectors at both end sections thereof, and is electrically connected to a conductor of an external electronic device (hereinafter referred to as an external conductor of an external device) via a connection connector provided in the rotator and a connection connector provided in the stator.

Note that the connection connectors provided at both ends of the flat cable each include a busbar including connection terminal sections that are connected to a terminal of the external conductor and a holder that holds the busbar. The bus bar includes conductor connection sections that are electrically connected to a conductor of the flat cable, and a coupling section that couples the conductor connection sections with the connection terminal sections.

As a result of specifications being diversified in recent years, there are cases in which various external devices such as LEDs for illumination are electrically connected via the rotary connector device. In such a case, an electric circuit that energizes the conductor of the flat cable may be damaged as a result of an excessively large current (hereinafter referred to as overcurrent), which is caused by noise and the like generated in a LED circuit, for example, flowing into the electric circuit.

Thus, in a rotary connector device described in Patent Document 1, one section of a coupling section of a busbar is separated, and this section is used as an electronic component arrangement section, in which an electronic component, such as a resistance element, is arranged. The electronic component is arranged in the electronic component arrangement section, and the connection terminal section and the conductor connection section are electrically coupled with each other via the electronic component. In this way, overcurrent is prevented from flowing into the electric circuit for energizing the electronic component, and it is considered that damage to the electric circuit can be prevented.

However, depending on the handling and the specification, there are some rotary connector devices to which only external devices in which the overcurrent may not be generated are connected, and in those cases, the electronic component, such as the resistance, need not be arranged. Thus, it is necessary to prepare other connection connectors that are not provided with the electronic component arrangement section.

PRIOR ART DOCUMENT

Patent Document

Patent Document 1: JP 2013-191437 A

SUMMARY OF THE INVENTION

Problems to be Solved by the Invention

In light of the foregoing, an object of the present invention is to provide a connection connector that can be commonly used irrespective of whether an electronic component is arranged or not, a connection connector-provided flat cable including the connection connector at an end section thereof, and a rotary connector device including the connection connector-provided flat cable.

Means to Solve the Problem

According to an aspect of the present invention, a connection connector that is arranged at an end section of a flat cable including a plurality of conductors includes: a busbar including a connection terminal section to be connected to another terminal; and a holder configured to hold the busbar. The busbar includes a conductor connection section to be electrically connected to a conductor of the plurality of conductors and a coupling section coupling the connection terminal section with the conductor connection section. The coupling section includes an electronic component arrangement section, in which an electronic component can be arranged, and a selective detachment section configured to be selectively detached depending on an arrangement of the electronic component in the electronic component arrangement section and electrically separate the connection terminal section and the conductor connection section.

Further, according to an aspect of the present invention, a connection connector-provided flat cable includes the flat cable including the plurality of conductors and the above-described connection connector. In addition, according to an aspect of the present invention, a rotary connector device includes a rotator including a rotating-side ring plate having an annular shape and an inner-circumferential cylindrical section having a cylindrical shape and formed on an inner-circumferential edge of the rotating-side ring plate, and a stator including a stationary-side ring plate having an annular shape and an outer-circumferential cylindrical section having a cylindrical shape and formed on an outer-circumferential edge of the stationary-side ring plate. The rotator and the stator are fitted with each other rotatably relative to each other in a clockwise direction and a counterclockwise direction. The above-described connection connector-provided flat cable is housed in a housing space defined by the rotating-side ring plate and the inner-circumferential cylindrical section of the rotator, and the stationary-side ring plate and the outer-circumferential cylindrical section of the stator. The rotary connector device is electrically connected to an external conductor via the connection connector of the rotator and the connection connector of the stator.

The other terminal described above is a connection terminal connected to a conductor of an external electronic device that is to be electrically connected via the rotary connector device.

The above-described selective detachment means that the selective detachment section is not detached when the electronic component is not arranged in the electronic component arrangement section, and the selective detachment section is detached when the electronic component is arranged.

The electronic component can be configured by a circuit protecting component that protects an electric circuit, such as a resistance element, a diode, or a thermistor.

With this invention, the connection connector can be commonly used irrespective of whether the electronic component is arranged in the electronic component arrangement section or not.

In more detail, since the coupling section of the busbar that configures the connection connector includes the electronic component arrangement section in which the electronic component, such as a resistance element, can be arranged, and the selective detachment section configured to be selectively detached depending on an arrangement of the electronic component in the electronic component arrangement section and electrically separate the connection terminal section and the conductor connection section, when the electronic component is arranged in the electronic component arrangement section, by detaching the selective detachment section, the connection terminal section is electrically connected with the conductor connection section via the electronic component arranged in the electronic component arrangement section. In this way, when the electronic component is arranged, an electric circuit that is conducted through the electronic component is configured, and it is thus possible to prevent the electric circuit from being damaged due to an inflow of overcurrent.

On the other hand, when the electronic component is not arranged in the electronic component arrangement section due to a reason that only external devices that may not generate the overcurrent are to be connected, for example, since the selective detachment section is not detached, the connection terminal section is electrically connected with the conductor connection section via the selective detachment section that is not detached.

Thus, with the connection connector according to an aspect of the present invention, one type of connection connector can be commonly used irrespective of whether the electronic component is arranged in the electronic component arrangement section or not, and thus, an increase in the number of parts can be prevented.

As an aspect of this invention, the electronic component arrangement section and the selective detachment section may be arranged sideward from the holder.

The above-described "sideward from the holder" does not mean "inside the holder", but means "outward from the outer edge of the holder".

With this invention, the electronic component arrangement section and the selective detachment section are positioned at a position outside the holder, and as a result, the arrangement of the electronic component in the electronic component arrangement section, the electrical connection of the electronic component, and the detachment of the selective detachment section can be carried out with ease compared with a case in which the electronic component arrangement section and the selective detachment section are arranged inside the holder.

Further, since the electronic component arrangement section and the selective detachment section are arranged sideward from the holder, the connection connector can be made small compared with a case in which the electronic component arrangement section and the selective detachment section are surrounded by part of the holder.

Also, as an aspect of this invention, the holder may include an extended section extending toward a side where the electronic component arrangement section and the selective detachment section are arranged.

With this invention, the electronic component arranged in the electronic component arrangement section, connecting sections of the electronic component, or the selective detachment section can be prevented from being damaged due to external factors, such as contact from the outside. Thus, stable electrical conductivity can be ensured.

Also, as an aspect of this invention, lead arrangement sections, to which a lead section of the electronic component arranged in the electronic component arrangement section is electrically connected, may be provided on both sides of the electronic component arrangement section in the coupling section.

With this invention, connection workability of the lead section of the electronic component is improved, the lead section is reliably connected to the lead arrangement sections, and even more stable electrical conductivity can be ensured.

Also, as an aspect of this invention, the selective detachment section may couple the lead arrangement sections and be arranged on a side away from the holder of the lead arrangement sections, and the electronic component arrangement section may be formed on a side closer to the holder of the lead arrangement sections.

With this invention, since the selective detachment section arranged sideward from the holder is positioned further to the outside of the holder, detachment operation workability of the selective detachment section can be improved.

Also, as an aspect of this invention, an inspection connection section, to which conductivity inspection equipment is connected, may be provided on a side closer to the conductor connection section than the selective detachment section in the coupling section.

With this invention, by coupling the connection terminal section of the busbar with the inspection connection section so as to configure an electric circuit and connecting the conductivity inspection equipment to the electric circuit, electrical conductivity of the electronic component, namely, a failure and the like of the electronic component can be inspected. Further, by coupling the conductor of the flat cable connected to the conductor connection section of the busbar with the inspection connection section so as to configure an electric circuit and connecting the conductivity inspection equipment to the electric circuit, conductivity of the conductor, namely, damage and the like to the conductor can be reliably inspected without going through the electronic component.

Also, as an aspect of this invention, a case body configured to house the holder may be provided, and the inspection connection section may be arranged inside the case body in a state in which the holder is housed in the case body.

With this invention, since the inspection connection section is not exposed in a state of use in which the connection connector is housed in the case body, conductivity of connecting sections with the busbar and the conductor can be prevented from deteriorating due to external factors, such as contact from the outside, including contact to the inspection connection section, for example.

Effects of the Invention

The present invention can provide a connection connector that can be commonly used irrespective of whether an electronic component is arranged or not, a connection connector-provided flat cable including the connection connector at an end section thereof, and a rotary connector device including the connection connector-provided flat cable.

BEST MODE FOR CARRYING OUT THE INVENTION

Figure 1:
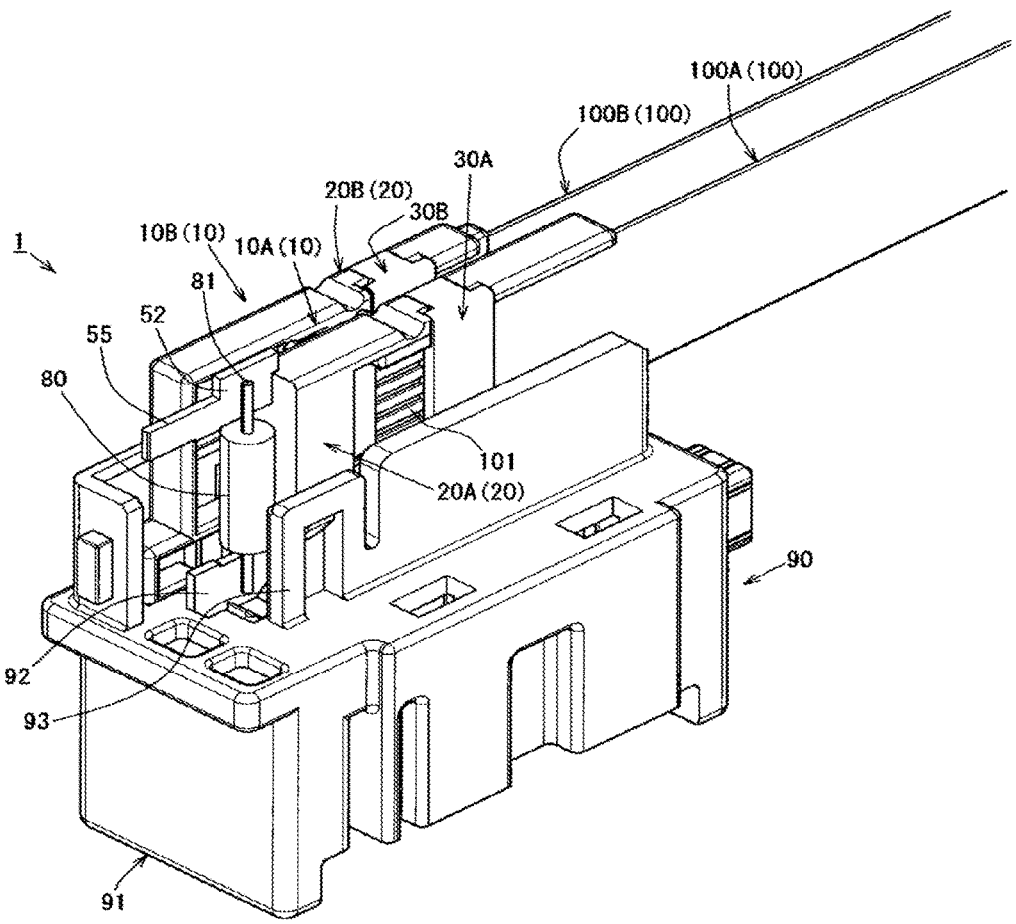
FIG. 1 is a perspective view of a connection connector-provided flat cable.
Figure 2A:
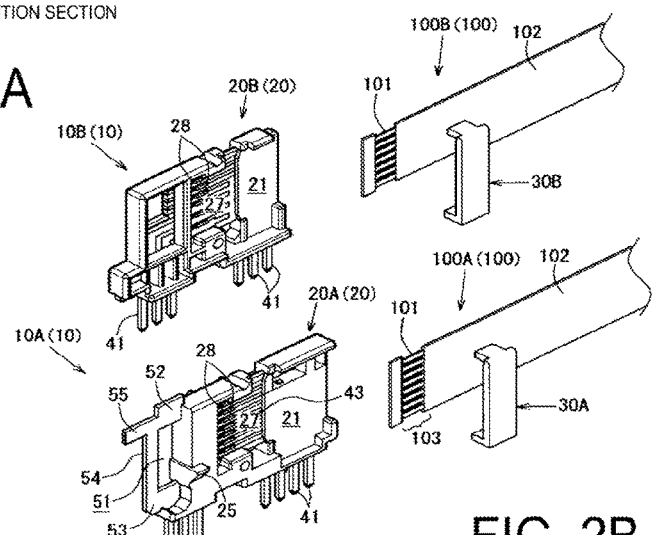
FIGS. 2A and 2B are exploded perspective views of a connection connector-provided flat cable.
Figure 2B:
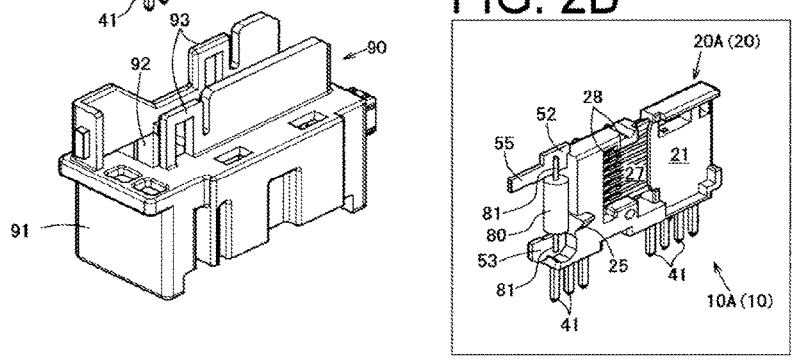
Figure 3A:
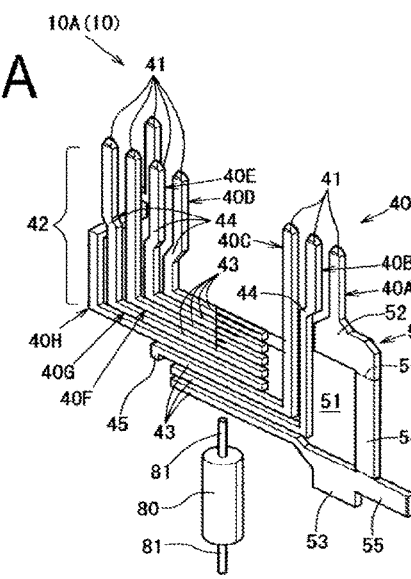
FIGS. 3A and 3B are explanatory diagrams, using exploded perspective views, of a connection connector.
Figure 3B:
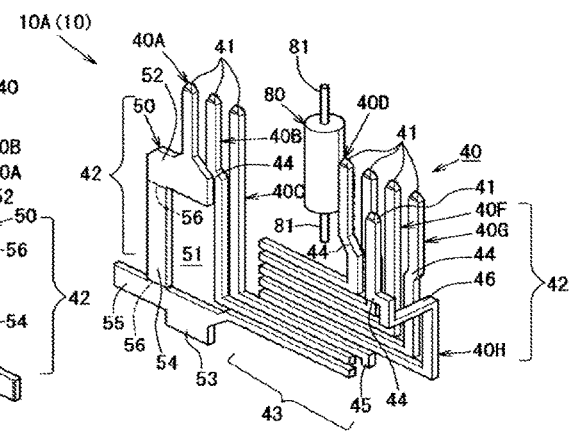
Figure 3B:
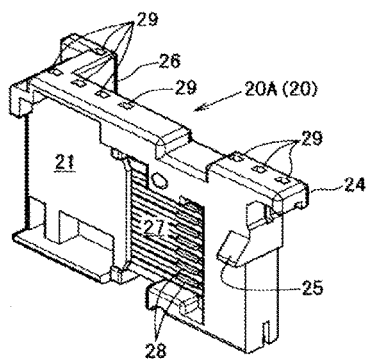
Figure 3B:
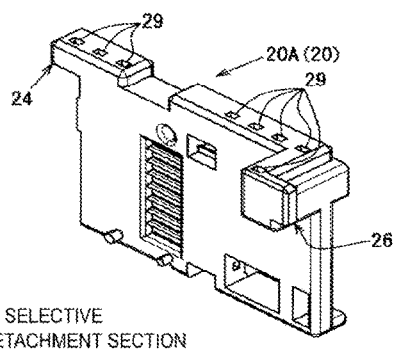
Figure 4A:
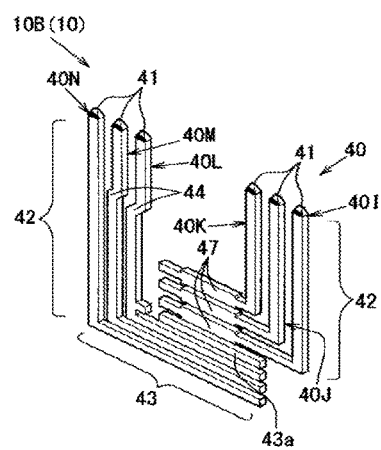
FIGS. 4A and 4B are explanatory diagrams, using exploded perspective views, of a connection connector.
Figure 4B:
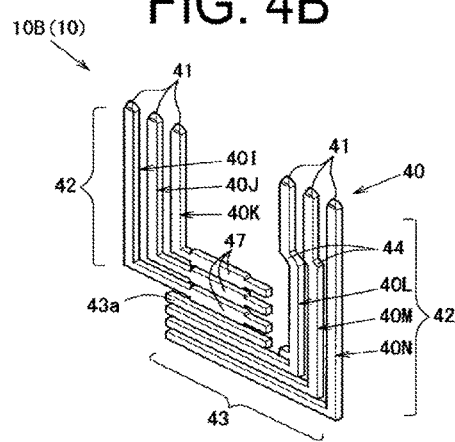
Figure 4B:
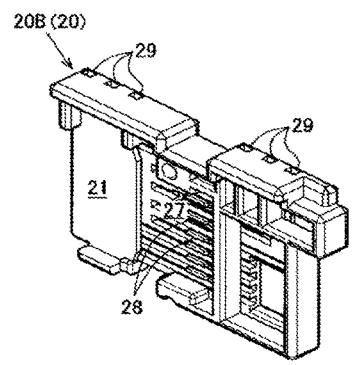
Figure 4B:
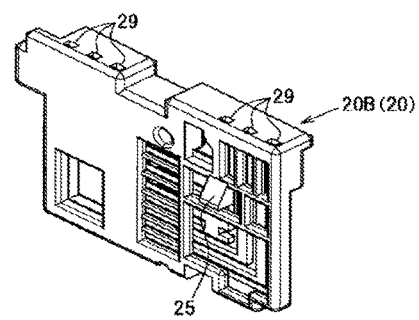

FIG. 1 is a perspective view of a connection connector-provided flat cable 1, FIGS. 2A and 2B are exploded perspective views of the connection connector-provided flat cable 1, FIGS. 3A and 3B are explanatory diagrams, using exploded perspective views, of a connection connector 10A that configures the connection connector-provided flat cable 1, and FIGS. 4A and 4B are explanatory diagrams, using exploded perspective views, of a connection connector 10B.

In more detail, FIG. 1 is a perspective view of a first end section of the connection connector-provided flat cable 1, FIG. 2A is an exploded perspective view of the connection connector-provided flat cable 1 in a state in which a resistance element 80 is not attached in a resistance element arrangement space 51 of the connection connector 10A, and FIG. 2B is a perspective view of the connection connector 10A in which the resistance element 80 is mounted in the resistance element arrangement space 51.

Further, FIG. 3A is an exploded perspective view of the front side of the connection connector 10A, FIG. 3B is an exploded perspective view of the back side of the connection connector 10A, FIG. 4A is an exploded perspective view of the front side of the connection connector 10B, and FIG. 4B is an exploded perspective view of the back side of the connection connector 10B.

Figure 5A:
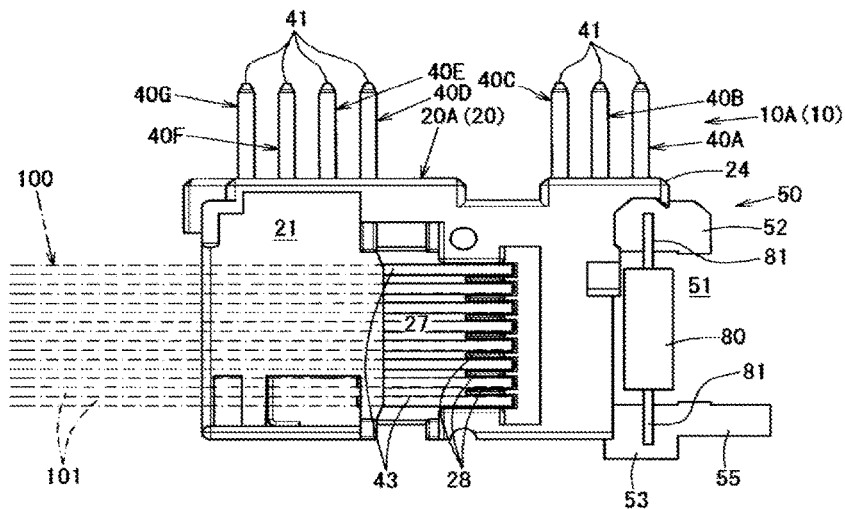
FIGS. 5A and 5B are explanatory diagrams of a connection connector.
Figure 5B:
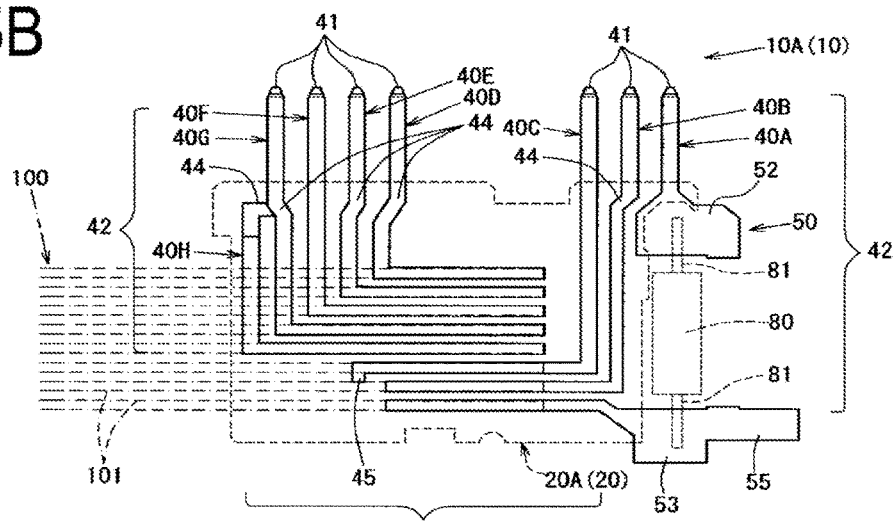

Further, FIGS. 5A and 5B, and FIGS. 6A and 6B are explanatory diagrams of the connection connector 10A. In more detail, FIG. 5A is a front view of the connection connector 10A in a state in which a flat cable 100 (hereinafter referred to as an FFC 100) is connected to the connection connector 10A and the resistance element 80 is mounted in the resistance element arrangement space 51, and FIG. 5B is a front view of the connection connector 10A in the same state, with a resin holder 20 being made transparent.

Figure 6A:
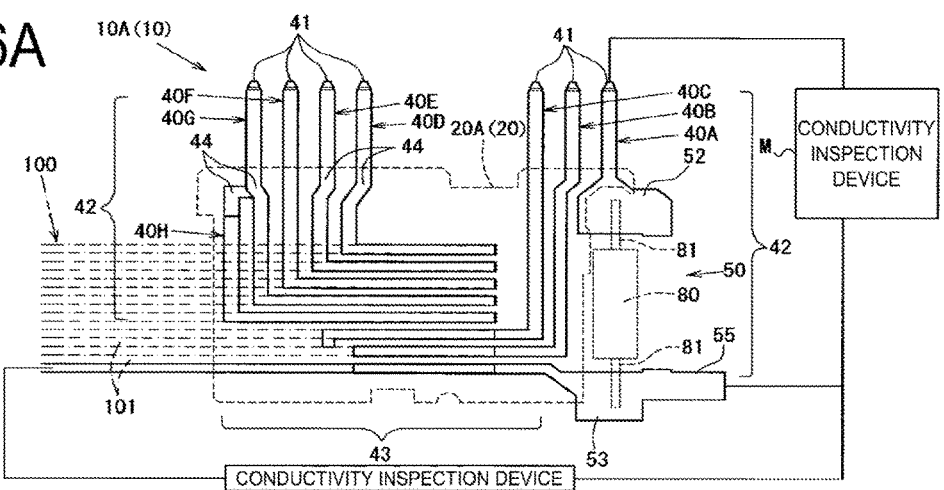
FIGS. 6A and 6B are explanatory diagrams of a connection connector.
Figure 6B:
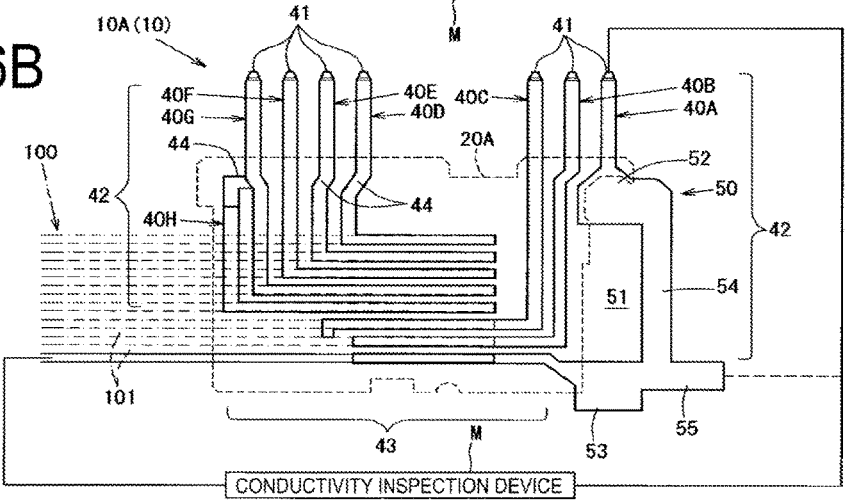

Further, FIG. 6A is a front view of a state in which a conductivity inspection is performed on the connection connector 10A, which is in a state in which the resistance element 80 is mounted in the resistance element arrangement space 51, and FIG. 6B is a front view of the connection connector 10A that is in a state in which the resistance element 80 is not mounted in the resistance element arrangement space 51 and a selective detachment section 54 is not detached.

Note that an orientation of the connection connector 10 in FIG. 1 and FIGS. 2A and 2B is reversed in the up-down direction in FIG. 3A to FIG. 6B.

Figure 7:
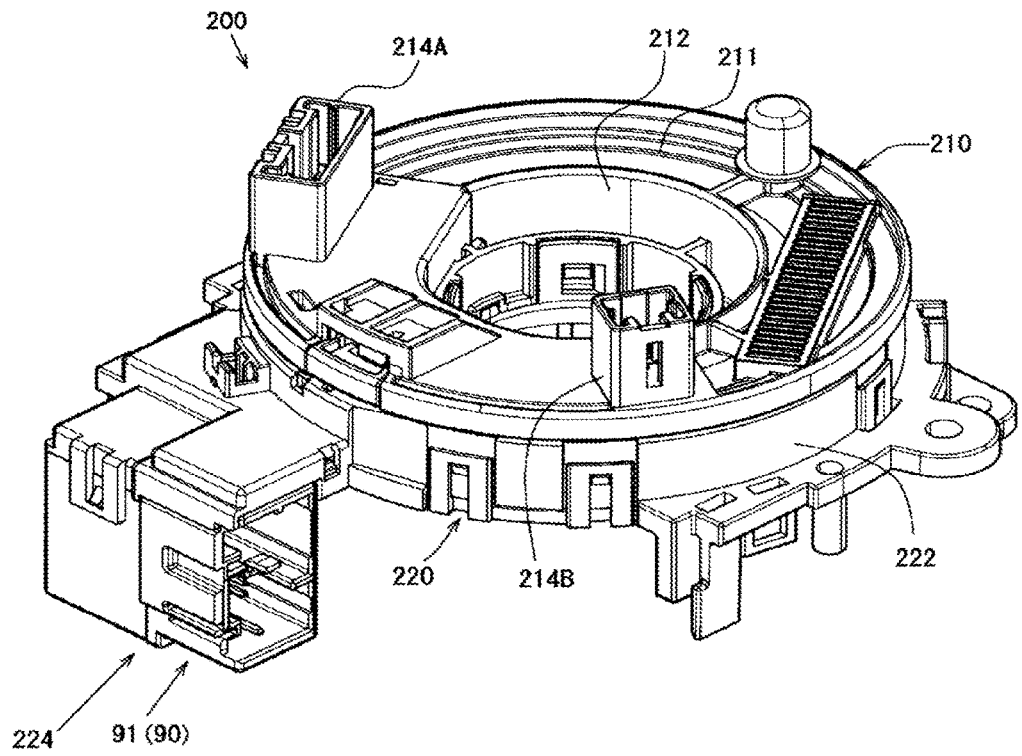
FIG. 7 is a perspective view of a rotary connector device.
Figure 8:
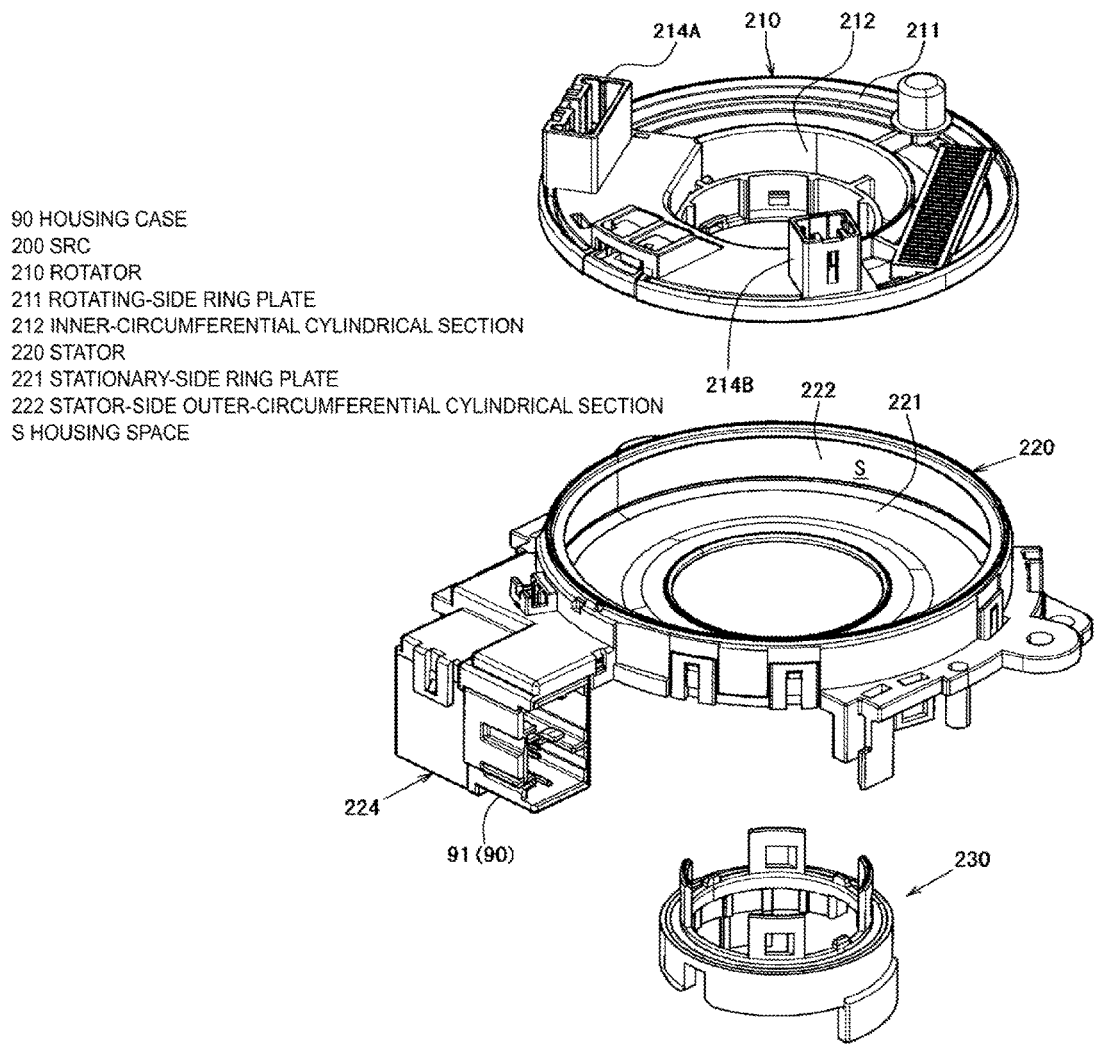
FIG. 8 is an exploded perspective view of a rotary connector device.

Further, FIG. 7 is a perspective view of a rotary connector device 200 (hereinafter referred to as SRC 200) to which the connection connector-provided flat cable 1 is attached, and FIG. 8 is an exploded perspective view of the SRC 200. Note that a connection connector and the FFC 100 that are provided on another end of the connection connector-provided flat cable 1 are omitted and not illustrated in FIG. 8.

As illustrated in FIG. 1 and FIGS. 2A and 2B, the connection connector-provided flat cable 1 that is to be attached to the SRC 200 (to be described later) includes two of the FFCs 100 (100A and 100B), the connection connectors 10 (10A and 10B) provided at an end section of each of the FFCs 100, and a housing case 90 that houses the connection connector 10. Further, the connection connector-provided flat cable 1 is configured such that two of the FFCs 100 and the connection connectors 10A and 10B overlap with each other in the front-back direction (the thickness direction).

The FFC 100 includes a plurality of strip-shaped conductors 101 and an insulating covering 102 that insulates the strip-shaped conductors 101 arranged in parallel, by sandwiching the strip-shaped conductors 101 between two sides thereof. Note that the FFC 100A connected to the connection connector 10A includes eight of the strip-shaped conductors 101, and the FFC 100B connected to the connection connector 10B includes seven of the strip-shaped conductors 101.

Further, as illustrated in FIG. 2A, the insulating covering 102 of the FFC 100 is peeled off at a part of the FFC 100 that is connected to the connection connector 10, and a conductor exposure section 103, in which the strip-shaped conductors 101 of a predetermined length are exposed, is formed in the FFC 100.

Note that the strip-shaped conductors 101 configuring the FFC 100 may be wide conductors that configure a circuit for an air bag, for example, and the FFC 100 may be configured such that the plurality of strip-shaped conductors 101 are all the wide conductors, or such that some of the plurality of strip-shaped conductors 101 are the wide conductors. Further, the strip-shaped conductors 101 may include the wide conductors in both of the FFC 100A and the FFC 100B, or in only one of the FFC 100A and the FFC 100B.

The connection connector 10 (10A and 10B) includes the resin holder 20 (20A and 20B), a mold cover 30 that fixes the FFC 100 to the resin holder 20, and busbars 40.

The mold cover 30 (30A and 30B) is wider than the FFC 100 (100A and 100B) (wider in the height direction in FIGS. 2A and 2B), is formed in a substantially C shape in a side view, is provided with locking sections that are locked with the resin holder 20 (to be described later) at both ends thereof in the up-down direction, and is configured so as to fix the FFC 100 that is attached to the resin holder 20.

Although the resin holder 20 (20A and 20B) is a resin member that integrally holds a plurality of the busbars 40 (to be described later), the resin holder 20 need not necessarily be formed by resin as long as it has insulating properties.

More specifically, as illustrated in FIGS. 3A and 3B, the resin holder 20A configuring the connection connector 10A is formed in a substantially wide rectangular shape in a front view, and internally includes a busbar attachment section 29 to which the plurality of busbars 40 are attached such that the plurality of busbars 40 can be insulated. Also, the resin holder 20A includes a concave-shaped FFC attachment section 21, which is provided on the front side thereof and to which the FFC 100A is attached, a side extended section 24 protruding sideways on the upper end side of the resin holder 20A, a locking claw section 25 configured to be locked and fixed with a locking frame section 93 of the housing case 90 (to be described later), and a back surface protruding section 26 protruding from the back surface at the upper end of the resin holder 20A on the opposite side to the side extended section 24 in the width direction. Note that the locking claw section 25 is formed in a triangular shape in a side view and protrudes from the front surface.

Further, in the FFC attachment section 21, a busbar exposure section 27 is formed that exposes conductor connection sections 43 of the busbars 40 attached to the busbar attachment section 29. Interval maintaining sections 28 are provided that are arranged in the busbar exposure section 27 in the up-down direction so as to maintain intervals between longitudinal coupling sections 42 of the busbars 40. Note that the interval maintaining section 28 also functions as a twist stopper for the strip-shaped conductors 101 of the FFC 100 that are to be connected to the longitudinal coupling section 42.

The resin holder 20B configuring the connection connector 10B has a similar configuration to the resin holder 20A, excepting that the resin holder 20B is not provided with the back surface protruding section 26, and that the locking claw section 25 thereof protrudes from the back surface. Therefore, although the resin holders 20A and 20B are shaped and arranged differently, a detailed description of the resin holder 20B is omitted herein.

Schematically, the busbars 40 are formed of metal in a substantially L-shape in a front view or a substantially reverse L-shape in a front view, and includes the longitudinal coupling sections 42, each including a connection pin section 41 at the leading end thereof, and the conductor connection sections 43 orthogonal to the longitudinal coupling sections 42 and configured to be connected to the strip-shaped conductors 101.

In more detail, as illustrated in FIGS. 3A and 3B and FIGS. 4A and 4B, the busbars 40 consist of eight busbars 40A to 40H configured to be attached to the resin holder 20A and six busbars 40I to 40N configured to be attached to the resin holder 20B, and, as described above, briefly, each of the busbars 40 includes the longitudinal coupling section 42 and the conductor connection section 43.

Note that, in FIG. 3A, of the eight busbars 40 arranged in the connection connector 10A, the busbars 40A to 40C are arranged on the right side in a front view and formed in the substantially reverse L-shape in a front view, and the remaining busbars 40D to 40H are arranged on the left side in a front view and formed in the substantially L-shape in a front view.

As illustrated in FIG. 3A, the busbar 40A is arranged on the rightmost side in the width direction in the connection connector 10A, and configured, in the substantially reverse L-shape in a front view, by the longitudinal coupling section 42 and the conductor connection section 43 extending leftward in a front view with respect to the longitudinal coupling section 42.

Further, the busbar 40A includes the longitudinal coupling section 42 including a resistance element attachment section 50 on which the resistance element 80 can be mounted.

As illustrated in FIG. 3A, the resistance element attachment section 50 includes the resistance element arrangement space 51 in which the resistance element 80 is arranged, lead arrangement sections 52 and 53 provided above and below the resistance element arrangement space 51, the selective detachment section 54 coupling the lead arrangement sections 52 and 53 further to the right side than the resistance element arrangement space 51 in a front view, and an inspection connection section 55 protruding further rightward than the lead arrangement section 53 below the selective detachment section 54.

Note that the selective detachment section 54 is detached from the resistance element attachment section 50 as a result of a cutting line 56 being cut, for example, the cutting line 56 being indicated by a broken line in FIGS. 3A and 3B. By the selective detachment section 54 being detached, the resistance element 80 can be arranged in the resistance element arrangement space 51, and the lead arrangement section 52 and the lead arrangement section 53 are also electrically separated.

In FIG. 3A, the busbar 40B is configured, in the substantially reverse L-shape in a front view, by the longitudinal coupling section 42 arranged leftward from the busbar 40A and the conductor connection section 43 arranged above the busbar 40A. Below the connection pin section 41 of the busbar 40B, a bent section 44 bent diagonally downward to the left is provided.

In FIG. 3A, the busbar 40C is configured, in the substantially reverse L-shape in a front view, by the longitudinal coupling section 42 arranged leftward from the busbar 40B and the conductor connection section 43 arranged above the busbar 40B and formed to be longer than that of the busbar 40B. At the leading end of the conductor connection section 43, a folded section 45 is formed that is folded downwardly.

As illustrated in FIG. 3A, of the five busbars 40 arranged on the left side in the connection connector 10A in a front view, the busbar 40D is arranged in the rightmost and uppermost position. The busbar 40D is configured, in the substantially L-shape in a front view, by the longitudinal coupling section 42 including the bent section 44 bent diagonally downward to the left below the connection pin section 41, and the conductor connection section 43 extending rightward.

As illustrated in FIG. 3A, the busbar 40E is arranged leftward from the busbar 40D and configured, in the substantially L-shape in a front view, by the longitudinal coupling section 42 including the bent section 44 bent diagonally downward to the left below the connection pin section 41, and the conductor connection section 43 arranged below the busbar 40D. The busbar 40F is configured, in the substantially L-shape in a front view, by the linear longitudinal coupling section 42 arranged leftward from the busbar 40E, and the conductor connection section 43 arranged below the busbar 40E, and the busbar 40G is arranged leftward from the busbar 40F and configured, in the substantially L-shape in a front view, by the longitudinal coupling section 42 including the bent section 44 bent diagonally downward to the right below the connection pin section 41, and the conductor connection section 43 arranged below the busbar 40E.

In FIG. 3A, the busbar 40H is arranged leftward from the busbar 40G and configured, in the substantially L-shape in a front view, by the longitudinal coupling section 42 including the bent section 44 bent diagonally downward to the left below the connection pin section 41, a folding bent section 46 that folds and shifts the connection pin section 41 toward the back side, and the conductor connection section 43 arranged below the busbar 40D.

Note that all the conductor connection sections 43 of the busbars 40D to 40H arranged on the left side of the connection connector 10A are formed in a linear shape, and the lengths of the conductor connection sections 43 are formed so as to become gradually longer from the busbar 40D to the busbar 40H, such that positions of right-side end sections of the conductor connection sections 43 are aligned with each other. Further, the conductor connection sections 43 of the busbars 40D, 40E, 40F, 40G, 40H, 40C, 40B, and 40A are arranged in this order from the top.

As illustrated in FIGS. 5A and 5B, the busbars 40A to 40H configured as described above are attached to the connection connector 10A, and the connection pin sections 41 protrude upwardly from the upper surface of the resin holder 20A. Also, the conductor connection sections 43 are exposed to the front side at the busbar exposure section 27 in the above-described order.

Further, the connection pin section 41 of the busbar 40H including the folding bent section 46 protrudes from the upper surface side of the back surface protruding section 26, at the same position as the connection pin section 41 of the busbar 40G in the width direction.

Then, as illustrated in FIG. 5A, the resistance element attachment section 50 of the busbar 40A is arranged protruding rightward below the side extended section 24 of the resin holder 20A of the connection connector 10A.

Next, the six busbars 40I to 40N arranged in the resin holder 20B will be described with reference to FIGS. 4A and 4B.

In FIG. 4A, of the six busbars 40 arranged in the resin holder 20B, the busbars 40I to 40K are each formed in the substantially reverse L-shape and arranged on the right side in a front view, and the remaining busbars 40L to 40N are formed in the substantially L-shape and arranged on the left side in a front view.

As illustrated in FIG. 4A, the busbar 40I is configured, in the substantially reverse L-shape in a front view, by the longitudinal coupling section 42 arranged to the rightmost side in the width direction of the connection connector 10B, and the conductor connection section 43 extending leftward in a front view with respect to the longitudinal coupling section 42. Note that an expanded section 47 expanded in the vertical direction is formed partway along the conductor connection section 43.

In FIG. 4A, the busbar 40J is configured, in the substantially reverse L-shape in a front view, by the longitudinal coupling section 42 arranged leftward from the busbar 40I, and the conductor connection section 43 arranged above the busbar 40I and having a length shorter than that of the busbar 40I. Note that the expanded section 47 expanded in the vertical direction is formed partway along the conductor connection section 43.

In FIG. 4A, the busbar 40K is configured, in the substantially reverse L-shape in a front view, by the longitudinal coupling section 42 arranged leftward from the busbar 40J, and the conductor connection section 43 arranged above the busbar 40J and having a length shorter than that of the busbar 40J. Further, the expanded section 47 expanded in the vertical direction is formed partway along the conductor connection section 43. The leading ends of the conductor connection sections 43 and the expanded sections 47 of the busbars 40I to 40K are arranged such that positions thereof in the width direction are aligned with each other.

As illustrated in FIG. 4A, of the three busbars 40 arranged on the left side in a front view in the connection connector 10B, the busbar 40L is arranged in the rightmost and uppermost position. The busbar 40L is configured, in the substantially L-shape in a front view, by the longitudinal coupling section 42 including the bent section bent diagonally downward to the left below the connection pin section 41, and two of the conductor connection sections 43 extending rightward. Note that, of the two conductor connection sections 43 of the busbar 40L, a right-side section of the upper conductor connection section 43 is divided so as to configure a divided conductor connection section 43a divided from the conductor connection section 43 by a prescribed interval.

As illustrated in FIG. 4A, the busbar 40M is arranged leftward from the busbar 40L and configured, in the substantially L-shape in a front view, by the longitudinal coupling section 42 including the bent section 44 bent diagonally downward to the left below the connection pin section 41, and the conductor connection section 43 arranged below the busbar 40L, and the busbar 40N is configured, in the substantially L-shape in a front view, by the linear longitudinal coupling section 42 arranged leftward from the busbar 40M and the conductor connection section 43 arranged below the busbar 40M.

Note that, as illustrated in FIG. 4A, all the conductor connection sections 43 of the busbars 40L to 40N arranged on the left side in the connection connector 10B are formed in a linear shape, and the lengths of the conductor connection sections 43 are formed so as to become gradually longer from the busbar 40L to the busbar 40N, such that positions of right-side end sections of the conductor connection sections 43 are aligned with each other. Further, the conductor connection sections 43 of the busbars 40K, 40J, 40I, 40L, 40M, and 40N are arranged in this order from the top.

The busbars 40I to 40N configured as described above are attached to the connection connector 10B, and the connection pin sections 41 protrude upwardly from the upper surface of the resin holder 20B. Also, the conductor connection sections 43 are exposed to the front side at the busbar exposure section 27 in the above-described order.

Further, as illustrated in FIGS. 2A and 2B, in the connection connector 10 configured by attaching the busbars 40 to the resin holder 20 configured as described above, the FFCs 100 are arranged in the FFC attachment sections 21 such that the busbar exposure sections 27 face the conductor exposure sections 103.

Then, the strip-shaped conductors 101 exposed at the conductor exposure sections 103 are joined with the conductor connection sections 43 exposed at the busbar exposure sections 27, respectively. Further, by engaging the mold covers 30, the connection connector 10 is attached to the FFC 100.

At this time, the strip-shaped conductors 101 of the FFC 100B are also connected to the divided conductor connection section 43a of the upper conductor connection section 43 of the two conductor connection sections 43 of the busbar 40L in the resin holder 20B.

Note that, although FIG. 2A is an exploded perspective view of the connection connector 10A in which the resistance element 80 is not mounted, the connection connector 10A illustrated in FIG. 2B in which the resistance element 80 is mounted may also be incorporated.

Further, the connection connectors 10A and 10B, to which the FFCs 100 (100A and 100B) are attached, can configure the connection connector-provided flat cable 1 by being incorporated together in the front-back direction (the thickness direction) and housed in the housing case 90 (to be described later).

Note that, when the connection connector 10A and the connection connector 10B are incorporated together in the front-back direction (the thickness direction), the connection pin section 41 of the busbar 40H protruding upwardly from the back surface protruding section 26 of the connection connector 10A is arranged leftward from the connection pin section 41 of the busbar 40N protruding upwardly in the connection connector 10B, and is arranged side by side substantially in a row with the connection pin sections 41 of the busbars 40I to 40N.

Further, since the divided conductor connection section 43a of the upper conductor connection section 43 of the two conductor connection sections 43 of the busbar 40L in the resin holder 20B is not electrically connected to any of the connection pin sections 41, the strip-shaped conductor 101 of the FFC 100B connected to the divided conductor connection section 43a is not electrically connected and is thus not energized. More specifically, although the strip-shaped conductor 101 of the FFC 100B are not used as an electric circuit, since the corresponding strip-shaped conductor 101 of the FFC 100B is connected to the divided conductor connection section 43a, physical stability can be secured.

In other words, of the seven strip-shaped conductors 101 provided in the FFC 100, by connecting, to the busbars 40, not only the six strip-shaped conductors 101 that are used as electric circuits, but also the strip-shaped conductor 101 that is not used as the electric circuit, stability in a connection state is improved between the connection connector 10 and the FFC 100, and electrical stability between the strip-shaped conductors 101 and the busbars 40 can thus be improved.

The housing case 90 includes a connector housing 91 into which a female-type connector (not illustrated) connected to another external device is fitted, a connector attachment section 92 to which the connection connector 10 (10A and 10B) is attached above the connector housing 91, and the locking frame sections 93 configured to fix the connection connector 10 by engaging with the locking claw sections 25 of the connection connector 10 attached to the connector attachment section 92. The connector housing 91 configures a stator-side connector 224 of the SRC 200 (to be described later).

As described above, in a state in which the connection connector 10A and the connection connector 10B are arranged overlaid with each other in the front-back direction (the thickness direction), as illustrated in FIG. 2A, the connection connector 10 is inserted into the connector attachment section 92 from a side from which the connection pin sections 41 protrude, and fixed to the housing case 90 by causing the locking claw sections 25 to be locked with the locking frame sections 93.

In this way, in FIGS. 2A and 2B, the connection pin sections 41 of the connection connector 10 attached to the connector attachment section 92 protrude inside the connector housing 91 having an open bottom surface, and the housing case 90 to which the connection connector 10 is incorporated can thus configure a male-type connector including two rows of seven connection pins.

Further, the inspection connection section 55 of the connection connector 10A incorporated into the housing case 90 is arranged inside the housing case 90.

Next, with respect to the connection connector-provided flat cable 1 configured by incorporating, into the housing case 90, the connection connector 10 fixed to the FFC 100 in the above-described manner, a case in which the resistance element 80 is mounted, and a case in which the resistance element 80 is not mounted in the connection connector-provided flat cable 1 will be described.

When the resistance element 80 is mounted in the connection connector-provided flat cable 1, the resistance element 80 is mounted in the resistance element attachment section 50 of the connection connector 10A that configures the connection connector-provided flat cable 1.

The resistance element 80 has a predetermined resistance value, and includes a cylindrical main body and lead sections 81 extending both in the up and down directions of the main body.

As described above, the resistance element attachment section 50 formed in the longitudinal coupling section 42 of the busbar 40A includes the lead arrangement sections 52 and 53 provided above and below the resistance element arrangement space 51, in which the resistance element 80 is arranged, and the selective detachment section 54 coupling the lead arrangement sections 52 and 53 at a position further to the right side than the resistance element arrangement space 51 in a front view.

To mount the resistance element 80 in this type of resistance element attachment section 50, first, the selective detachment section 54 is detached by causing the cutting line 56 to be cut, then, the resistance element 80 is arranged in the resistance element arrangement space 51, and the lead sections 81 are connected to the lead arrangement sections 52 and 53.

When the selective detachment section 54 is not detached, namely, when the resistance element 80 is not mounted, the connection pin section 41 of the busbar 40A is electrically connected with the conductor connection section 43 thereof via the selective detachment section 54. On the other hand, when the resistance element 80 is mounted, namely, when the selective detachment section 54 is detached, the connection pin section 41 of the busbar 40A is electrically connected with the conductor connection section 43 thereof via the resistance element 80. Thus, the connection pin section 41 and the conductor connection section 43 of the busbar 40A are energized via the resistance element 80 arranged in the resistance element attachment section 50.

Therefore, as illustrated in FIG. 6A, by coupling the connection pin section 41 of the busbar 40A with the inspection connection section 55 so as to configure an electric circuit, and by connecting a conductivity inspection device M to the electric circuit, the electrical conductivity of the resistance element 80, namely, a failure and the like of the resistance element 80 can be inspected without going through the strip-shaped conductors 101. Further, by coupling the inspection connection section 55 with the other end section of the strip-shaped conductor 101 of the FFC 100A connected to the conductor connection section 43 of the busbar 40A so as to configure an electric circuit, and by connecting the conductivity inspection device M to the electric circuit, the conductivity of the strip-shaped conductors 101, namely, damage and the like to the strip-shaped conductors 101 can be inspected without going through the resistance element 80.

Furthermore, as illustrated in FIG. 6B, when the resistance element 80 is not mounted, by coupling the connection pin section 41 of the busbar 40A or the inspection connection section 55 with the other end section of the strip-shaped conductor 101 of the FFC 100A connected to the conductor connection section 43 of the busbar 40A so as to configure an electric circuit, and by connecting the conductivity inspection device M to the electric circuit, the conductivity of the strip-shaped conductors 101, namely, the damage and the like to the strip-shaped conductors 101 can be inspected.

Note that, in the connection connector-provided flat cable 1 configured as described above, the connection connector 10 is attached to a first end section of the FFC 100, a connection connector (not illustrated) is attached to a second end section thereof on the opposite side, and the connection connector-provided flat cable 1 is attached to the SRC 200 illustrated in FIG. 7 and FIG. 8.

As illustrated in FIG. 7 and FIG. 8, the SRC 200 is configured by combining a rotator 210 positioned above a stator 220, the stator 220 positioned below the rotator 210, and a sleeve 230 configured to be fixed by being integrated with the rotator 210. An annular housing space S that allows the connection connector-provided flat cable 1 to be housed is formed inside the rotator 210 and the stator 220 in a combined state.

As illustrated in FIG. 7 and FIG. 8, the rotator 210 is integrally configured by a substantially annular rotating-side ring plate 211 including a substantially circular through-hole in a center section thereof in a plan view, and an inner-circumferential cylindrical section 212 formed downwardly from an inner-circumferential edge section of the rotating-side ring plate 211.

Further, rotator-side connectors 214A and 214B that protrude upwardly and function as connectors are integrally formed on the upper surface of the rotating-side ring plate 211.

The connection connectors (not illustrated), which are respectively attached to the second end sections of the FFC 100A and the FFC 100B of the connection connector-provided flat cable 1 housed in the housing space S, are respectively attached to the rotator-side connectors 214A and 214B, and further, steering-side cables (not illustrated) drawn from electric circuits, such as a horn switch and an air bag unit arranged in a steering wheel (not illustrated), are connected to the rotator-side connectors 214A and 214B.

As illustrated in FIG. 8, the stator 220 includes a substantially annular stationary-side ring plate 221 including a substantially circular through-hole in a center section thereof in a plan view, and a substantially cylindrical outer-circumferential cylindrical section 222 extending upwardly from an outer-circumferential edge section of the stationary-side ring plate 221.

A stator-side connector 224 that protrudes downwardly and functions as a connector is integrally formed further to the outer-diameter side than the stationary-side ring plate 221.

As illustrated in FIG. 8, the outer-circumferential cylindrical section 222 is formed in a cylindrical shape extending in the up-down direction, while having a diameter slightly smaller than the outer diameter of the rotating-side ring plate 211 of the rotator 210. More specifically, in the combined state in which the rotator 210 and the stator 220 are combined together, the outer-circumferential cylindrical section 222 is arranged below the outer-circumferential edge section of the rotating-side ring plate 211.

The stator-side connector 224 is a connection connector that is connected, inside a steering column cover (not illustrated), to cables drawn from vehicle body-side electric circuits, and the housing case 90 of the above-described connection connector-provided flat cable 1 is incorporated to the stator-side connector 224.

As illustrated in FIG. 8, the sleeve 230 is a fixing member configured to be attached from below the stator 220 so as to rotatably fix the stator 220 to the rotator 210, and includes a through-hole formed in a center section thereof in a plan view, the through-hole penetrating the sleeve 230 in the up-down direction.

In the rotator 210 and the stator 220 configured as described above, the annular housing space S for housing the wound-around connection connector-provided flat cable 1 is defined by the bottom surface of the rotating-side ring plate 211, the upper surface of the stationary-side ring plate 221, the outer circumferential surface of the inner-circumferential cylindrical section 212, and the inner circumferential surface of the outer-circumferential cylindrical section 222 (see FIG. 8).

In more detail, the connection connector-provided flat cable 1 including the two FFC 100A and FFC 100B is housed in the housing space S, while being wound around as four cables after being bundled with two dummy cables. At this time, the connection connector 10 of the connection connector-provided flat cable 1 is connected to the stator-side connector 224, and the connection connector on the opposite side is connected to the rotator-side connector 214.

Further, of the four cables, the cables on the stator-side connector 224 side are housed in the housing space S while being wound along the outer-circumferential side of the housing space S, namely, the inner surface of the outer-circumferential cylindrical section 222.

Then, an intermediate section of each of the four cables is bent back in a U-turn shape, and the cables on the rotator-side connector 214 side are housed in the housing space S while being wound in a reverse direction along the inner side of the housing space S, namely, the outer circumferential surface of the inner-circumferential cylindrical section 212.

Note that bent-back sections, which are formed in the U-turn shape in each of the intermediate sections of the four cables, are arranged in the housing space S in positions along the circumferential direction at equal intervals, and a repulsive force of the bent-back sections formed in the U-turn shape urges the FFC 100 in the radial direction, the FFC 100 being housed in the housing space S while being wound along the outer side and the inner side of the housing space S.

The connection connector 10A configured described above of the connection connector-provided flat cable 1, which is configured to be housed in the housing space S of the SRC 200, is arranged at an end section of the FFC 100A including the plurality of strip-shaped conductors 101 and includes the plurality of busbars 40 (40A to 40H) including the connection pin sections 41 configured to be connected with other terminals, such as the steering-side cables connected to the rotator-side connector 214 of the SRC 200, and the resin holder 20A configured to hold the busbars 40. The busbars 40 include the conductor connection sections 43 configured to be electrically connected to the strip-shaped conductors 101 and the longitudinal coupling sections 42 coupling the connection pin sections 41 with the conductor connection sections 43. Since the longitudinal coupling section 42 of the busbar 40A includes the resistance element arrangement space 51, in which the resistance element 80 can be arranged, and the selective detachment section 54 that causes the connection pin section 41 to be electrically separated from the conductor connection section 43 by being selectively detached depending on the arrangement of the resistance element 80 in the resistance element arrangement space 51, the connection connector 10A can be commonly used irrespective of whether the resistance element 80 is arranged in the resistance element arrangement space 51 or not.

In more detail, since the longitudinal coupling section 42 of the busbar 40A that configures the connection connector 10A includes the resistance element arrangement space 51, in which the resistance element 80 can be arranged, and the selective detachment section 54 that causes the connection pin section 41 to be electrically separated from the conductor connection section 43 by being selectively detached depending on the arrangement of the resistance element 80 in the resistance element arrangement space 54, when the resistance element 80 is arranged in the resistance element arrangement space 51, by detaching the selective detachment section 54, the connection pin section 41 is electrically connected with the conductor connection section 43 via the resistance element 80 arranged in the resistance element arrangement space 51.

Thus, even when the overcurrent is generated due to the noise or the like of the external devices connected to the stator-side connectors 224, such as LEDs for illumination, since the overcurrent flows through the resistance element 80, electric circuits of the SRC 200 or devices connected to the SRC 200 can be prevented from being damaged further to the upstream side.

On the other hand, for example, when only the external devices that may not generate the overcurrent are connected via the stator-side connectors 224, namely, when the resistance element 80 is not arranged in the resistance element arrangement space 51, since the selective detachment section 54 is not detached, the connection pin section 41 is electrically connected with the conductor connection section 43 via the selective detachment section 54 that is not detached.

Thus, according to the connection connector 10A, for example, the one type of connection connector 10A can be commonly used, both when the resistance element 80 is arranged in the resistance element arrangement space 51 in accordance with the specification in which the external devices that may generate the overcurrent are attached, such as the LED for illumination, for example, and when the resistance element 80 is not arranged in the resistance element arrangement space 51 in accordance with the specifications in which only the external devices that may not generate the overcurrent are attached, for example, and thus, an increase in the number of parts can be prevented.

Further, by arranging the resistance element arrangement space 51 and the selective detachment section 54 sideward from the resin holder 20A, namely, not inside the resin holder 20A, but outside the outer edge of the resin holder 20A, the resistance element arrangement space 51 and the selective detachment section 54 are caused to be positioned outside the resin holder 20A, and the arrangement and electrical connection of the resistance element 80 to the resistance element arrangement space 51, and the detachment of the selective detachment section 54 can be achieved more easily than a case in which the resistance element arrangement space 51 and the selective detachment section 54 are arranged inside the resin holder 20A.

Further, since the resistance element arrangement space 51 and the selective detachment section 54 are arranged sideward from the resin holder 20A, the connection connector 10A can be configured in a more compact manner than a case in which the resistance element arrangement space 51 and the selective detachment section 54 are surrounded by the resin holder 20A.

Further, since the side extended section 24, which extends toward a side where the resistance element arrangement space 51 and the selective detachment section 54 are arranged, is provided in the resin holder 20A, damage due to external factors, such as contact from the outside, can be prevented to the resistance element 80 arranged in the resistance element arrangement space 51, to connecting sections between the lead sections 81 of the resistance element 80 and the lead arrangement sections 52 and 53, or to the selective detachment section 54. Thus, stable electrical conductivity can be ensured.

Further, since the lead arrangement sections 52 and 53, which cause the lead sections 81 of the resistance element 80 arranged in the resistance element arrangement space 51 to be electrically connected, are provided on both sides of the resistance element arrangement space 51 in the longitudinal coupling section 42, connection workability of the lead sections 81 of the resistance element 80 is improved. As a result, the lead sections 81 are reliably connected to the lead arrangement sections 52 and 53, and even more stable electrical conductivity can be ensured.

Further, by the selective detachment section 54 coupling the lead arrangement sections 52 and 53 and being arranged on a side away from the resin holder 20A of the lead arrangement sections 52 and 53, and also by the resistance element arrangement space 51 being formed on a side closer to the resin holder 20A than the selective detachment section 54, the selective detachment section 54 arranged protruding rightward from the resin holder 20A in a front view can be separated from the resin holder 20A, and detachment operation workability of the selective detachment section 54 can thus be improved.

Further, by the inspection connection section 55, to which the conductivity inspection equipment is connected, being provided closer to the conductor connection section 43 than the selective detachment section 54 in the longitudinal coupling section 42, as illustrated in FIG. 6A, the electrical conductivity of the resistance element 80, namely, a failure and the like of the resistance element 80 can be inspected without going through the strip-shaped conductors 101 by coupling the connection pin section 41 of the busbar 40A with the inspection connection section 55.

Further, by coupling the inspection connection section 55 with the other end section of the strip-shaped conductor 101 of the FFC 100A connected to the conductor connection section 43 of the busbar 40A, the conductivity of the strip-shaped conductors 101, namely, the damage and the like to the strip-shaped conductors 101 can be reliably inspected without going through the resistance element 80.

Furthermore, since the housing case 90 configured to house the resin holder 20A is provided, and the inspection connection section 55 is arranged inside the housing case 90 in a state in which the resin holder 20A is housed, the inspection connection section 55 is not exposed in a state of use in which the connection connector 10A is housed in the housing case 90, and thus, conductivity of connecting sections with the busbar 40A or the strip-shaped conductor 101 can be prevented from deteriorating due to external factors, such as contact from the outside, including contact with the inspection connection section 55, for example.

Note that the above-described effects of the connection connector 10A are achieved in the same manner in the connection connector-provided flat cable 1 including the connection connector 10A attached to the FFC 100A and the SRC 200. The SRC 200 includes the rotator 210 including the rotating-side ring plate 211 having an annular shape and the inner-circumferential cylindrical section 212 having a cylindrical shape and formed on an inner-circumferential edge of the rotating-side ring plate 211 and the stator 220 including the stationary-side ring plate 221 having an annular shape and the outer-circumferential cylindrical section 222 having a cylindrical shape and formed on an outer-circumferential edge of the stationary-side ring plate 221. The rotator and the stator are fitted with each other rotatably relative to each other in a clockwise direction and a counterclockwise direction. The above-described connection connector-provided flat cable 1 is housed in the housing space S defined by the rotating-side ring plate 211 and the inner-circumferential cylindrical section 212 of the rotator 201, and the stationary-side ring plate 221 and the outer-circumferential cylindrical section 222 of the stator 220. The SRC 200 is electrically connected to the external strip-shaped conductors 101 via the rotator-side connector 214 and the stator-side connector 224.

With respect to the correspondence between the configuration of the present invention and the above-described embodiment, a conductor corresponds to the strip-shaped conductor 101, a flat cable corresponds to the FFC 100, a connection terminal section corresponds to the connection pin section 41, a coupling section corresponds to the longitudinal coupling section 42, an electronic component corresponds to the resistance element 80, an electronic component arrangement section corresponds to the resistance element arrangement space 51, arranging sideward from a holder corresponds to arranging protruding rightward from the resin holder 20A, an extended section corresponds to the side extended section 24, a lead section corresponds to the lead section 81, a case body corresponds to the housing case 90, a rotator corresponds to the rotator 210, a stationary-side ring plate corresponds to the stationary-side ring plate 221, and a stator corresponds to the stator 220.

Although a rotary connector device corresponds to the SRC 200, the present invention is not limited to the configuration of the above-described embodiment, and many other embodiments can also be employed.

For example, in the present embodiment, although the resistance element 80 is attached, as the electronic component, in the resistance element arrangement space 51 that functions as the electronic component arrangement section, a circuit protecting component and the like that protects an electric circuit, such as a diode or a thermistor, may be attached in place of the resistance element 80.

Further, although the connection connector-provided flat cable 1 is used while being housed in the SRC 200, the connection connector-provided flat cable 1 may be used without being housed in the SRC 200.

Further, the connection connector 10 may be provided on both sides of the FFC 100 that configures the connection connector-provided flat cable 1, or the connection connector-provided flat cable 1 may be configured by arranging the connection connectors 10A in an overlapping manner in the front-back direction (the thickness direction).

Furthermore, in the description above, although the connection connector-provided flat cable 1 including the two cables, namely, the FFCs 100A and 100B, is housed in the housing space S, while being wound around as the four cables after being bundled with the two dummy cables, two pair of the connection connector-provided flat cables 1 including the two cables of the FFCs 100A and 100B may be bundled together, and four cables of the FFC 100 may be housed in the housing space S while being wound around. Further, one cable of the FFC 100 and three of the dummy cables may be used to configure the four cables, and those four cables may be housed in the housing space S while being wound around.

Further, in the housing space S of the SRC 200, although two of the dummy cables and the connection connector-provided flat cable 1 are bundled together, and the intermediate sections of the cables are bent back in the U-turn shape and arranged in the circumferential direction at equal intervals, the bent-back sections may be locked to a roller provided in a retainer arranged in the housing space S.

REFERENCE SIGNS LIST

1 Connection connector-provided flat cable
10A Connection connector
20A Resin holder
24 Side extended section
40A Busbar
41 Connection pin section
42 Longitudinal coupling section
43 Conductor connection section
51 Resistance element arrangement space
52, 53 Lead arrangement section
54 Selective detachment section
55 Inspection connection section
80 Resistance element
81 Lead section
90 Housing case
100 Flat cable (FFC)
101 Strip-shaped conductor
200 SRC
210 Rotator
211 Rotating-side ring plate
212 Inner-circumferential cylindrical section
220 Stator
221 Stationary-side ring plate
222 Stator-side outer-circumferential cylindrical section
S Housing space

The invention claimed is:

1. A connection connector, comprising:
   a busbar including a connection terminal section configured to be connected to another terminal; and
   a holder configured to hold the busbar,
   wherein the busbar includes a conductor connection section to be electrically connected to one of a plurality of conductors in a flat cable and a coupling section coupling the connection terminal section with the conductor connection section, and the coupling section includes an electronic component arrangement section in which an electronic component is able to be arranged and a selective detachment section configured to be selectively detached depending on an arrangement of the electronic component in the electronic component arrangement section and electrically separate the connection terminal section and the conductor connection section.

2. The connection connector according to claim 1, wherein an inspection connection section, to which conductivity inspection equipment is connected, is provided on a side closer to the conductor connection section than the selective detachment section in the coupling section.

3. The connection connector according to claim 2, further comprising:
   a case body configured to house the holder is provided,
   wherein the inspection connection section is arranged inside the case body in a state in which the holder is housed in the case body.

4. The connection connector according to claim 1, wherein lead arrangement sections, to which a lead section of the electronic component arranged in the electronic component arrangement section is electrically connected, are provided on both sides of the electronic component arrangement section in the coupling section.

5. The connection connector according to claim 4, wherein the selective detachment section couples the lead arrangement sections and is arranged on a side away from the holder of the lead arrangement sections, and the electronic component arrangement section is formed on a side closer to the holder of the lead arrangement sections.

6. The connection connector according to claim 5, wherein an inspection connection section, to which conductivity inspection equipment is connected, is provided on a side closer to the conductor connection section than the selective detachment section in the coupling section.

7. The connection connector according to claim 4, wherein an inspection connection section, to which conductivity inspection equipment is connected, is provided on a side closer to the conductor connection section than the selective detachment section in the coupling section.

8. The connection connector according to claim 7, further comprising:
a case body configured to house the holder is provided, wherein the inspection connection section is arranged inside the case body in a state in which the holder is housed in the case body.

9. The connection connector according to claim 1, wherein the electronic component arrangement section and the selective detachment section are arranged sideward from the holder.

10. The connection connector according to claim 9, wherein lead arrangement sections, to which a lead section of the electronic component arranged in the electronic component arrangement section is electrically connected, are provided on both sides of the electronic component arrangement section in the coupling section.

11. The connection connector according to claim 10, wherein the selective detachment section couples the lead arrangement sections and is arranged on a side away from the holder of the lead arrangement sections, and the electronic component arrangement section is formed on a side closer to the holder of the lead arrangement sections.

12. The connection connector according to claim 9, wherein an inspection connection section, to which conductivity inspection equipment is connected, is provided on a side closer to the conductor connection section than the selective detachment section in the coupling section.

13. The connection connector according to claim 12, further comprising:
a case body configured to house the holder is provided, wherein the inspection connection section is arranged inside the case body in a state in which the holder is housed in the case body.

14. The connection connector according to claim 9, wherein the holder includes an extended section extending toward a side where the electronic component arrangement section and the selective detachment section are arranged.

15. The connection connector according to claim 14, wherein lead arrangement sections, to which a lead section of the electronic component arranged in the electronic component arrangement section is electrically connected, are provided on both sides of the electronic component arrangement section in the coupling section.

16. The connection connector according to claim 15, wherein the selective detachment section couples the lead arrangement sections and is arranged on a side away from the holder of the lead arrangement sections, and the electronic component arrangement section is formed on a side closer to the holder of the lead arrangement sections.

17. The connection connector according to claim 14, wherein an inspection connection section, to which conductivity inspection equipment is connected, is provided on a side closer to the conductor connection section than the selective detachment section in the coupling section.

18. The connection connector according to claim 17, further comprising:
a case body configured to house the holder is provided, wherein the inspection connection section is arranged inside the case body in a state in which the holder is housed in the case body.

19. A rotary connector device, comprising:
a rotator including a rotating-side ring plate having an annular shape and an inner-circumferential cylindrical section having a cylindrical shape and formed on an inner-circumferential edge of the rotating-side ring plate;
a stator including a stationary-side ring plate having an annular shape and an outer-circumferential cylindrical section having a cylindrical shape and formed on an outer-circumferential edge of the stationary-side ring plate; and
a flat cable housed in a housing space defined by the rotating-side ring plate and the inner-circumferential cylindrical section of the rotator, and the stationary-side ring plate and the outer-circumferential cylindrical section of the stator,
wherein the rotator and the stator are fitted with each other rotatably relative to each other in a clockwise direction and a counterclockwise direction, the flat cable comprises a connection connector comprising a busbar including a connection terminal section configured to be connected to another terminal and a holder configured to hold the busbar, the busbar includes a conductor connection section to be electrically connected to one of a plurality of conductors in the flat cable and a coupling section coupling the connection terminal section with the conductor connection section, and the coupling section includes an electronic component arrangement section in which an electronic component is able to be arranged and a selective detachment section configured to be selectively detached depending on an arrangement of the electronic component in the electronic component arrangement section and electrically separate the connection terminal section and the conductor connection section, and the rotary connector device is electrically connected to an external conductor via the connection connector of the rotator and the connection connector of the stator.

* * * * *